US010265960B2

(12) United States Patent
Horiuchi

(10) Patent No.: US 10,265,960 B2
(45) Date of Patent: Apr. 23, 2019

(54) METHOD FOR MANUFACTURING LIQUID EJECTION HEAD

(71) Applicant: CANON KABUSHIKI KAISHA, Tokyo (JP)

(72) Inventor: Isamu Horiuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/955,576

(22) Filed: Apr. 17, 2018

(65) Prior Publication Data

US 2018/0304632 A1 Oct. 25, 2018

(30) Foreign Application Priority Data

Apr. 25, 2017 (JP) ................................ 2017-086450

(51) Int. Cl.
*H01L 21/00* (2006.01)
*B41J 2/16* (2006.01)

(52) U.S. Cl.
CPC .......... *B41J 2/1623* (2013.01); *B41J 2/1606* (2013.01)

(58) Field of Classification Search
CPC ...... B41J 2/1623; B41J 2/1621; B41J 2/1631; B41J 2/1606
See application file for complete search history.

(56) References Cited

U.S. PATENT DOCUMENTS

2003/0131475 A1* 7/2003 Conta ........................ B41J 2/16 29/890.1
2005/0205517 A1* 9/2005 Krawczyk .............. B41J 2/1603 216/27
2007/0076053 A1* 4/2007 Hart ....................... B41J 2/1603 347/47

FOREIGN PATENT DOCUMENTS

JP 2009001003 A 1/2009

* cited by examiner

*Primary Examiner* — Richard A Booth
(74) *Attorney, Agent, or Firm* — Canon U.S.A., Inc. IP Division

(57) ABSTRACT

A method for manufacturing a liquid ejection head includes forming a first negative photosensitive resin layer containing a photopolymerizable compound and a photopolymerization initiator over a substrate, exposing the first negative photosensitive resin layer to light to form a latent image of a flow channel member, forming a second negative photosensitive resin layer containing a photopolymerizable compound and a photopolymerization initiator over the first negative photosensitive resin layer having the latent image, and exposing the second negative photosensitive resin layer to light to form a latent image of an ejection opening member. The first negative photosensitive resin layer has a thickness of 10 μm or less and further contains a sensitivity adjusting agent capable of reducing the sensitivity of the first negative photosensitive resin layer. The transmittance A of the first negative photosensitive resin layer is 0.70 or less for the exposure light for the second negative photosensitive resin layer.

15 Claims, 4 Drawing Sheets

METHOD FOR MANUFACTURING LIQUID EJECTION HEAD

BACKGROUND

Field of the Disclosure

The present disclosure relates to a method for manufacturing a liquid ejection head.

Description of the Related Art

A liquid ejection head is used as, for example, an ink jet recording head in an ink jet recording apparatus for ejecting ink. The ink jet recording head typically has very small ejection openings, flow channels communicating with the ejection openings, and energy generating elements each disposed in a portion of the respective flow channels and adapted to generate energy for ejecting the liquid.

Japanese Patent Laid-Open No. 2009-01003 discloses a method for manufacturing such a liquid ejection head. In this method, first, a first negative photosensitive resin layer (chamber layer) is formed on a substrate and is then selectively exposed to light to cure the portions acting as walls defining ink flow channels. Subsequently, a second negative photosensitive resin layer (nozzle layer) is formed of a negative photosensitive resin over the previously formed photosensitive resin layer and is then selectively exposed to light to cure the portion thereof other than the portion for forming ejection openings. Then, the first and the second negative photosensitive resin layer are developed with a developer to remove the unexposed portions, thus forming the flow channels and ejection openings.

When an energy required for liquid ejection is applied to the liquid in a liquid ejection head, the liquid is formed into a long columellar shape extending in the direction in which the liquid is ejected. The liquid in the columellar shape is then cut at a rearward position and ejected in a droplet form. At this time, the end of the long liquid column is in a shape of a thin tail. If the tail is long, the liquid is divided into a main droplet and satellites, which follow the main droplet and land on paper, or causes mist, which does not land on the paper, to occur.

It has been known that it is effective in reducing the satellites and mist to reduce the height of the flow channels.

However, it has been found that when a liquid ejection head having flow channels with a small height is produced by the above-described method, the precision in shape of the ejection openings is reduced. This is probably because reducing the height of the flow channels reduces the distance between the substrate and the second negative photosensitive resin layer. More specifically, probably, when the second negative photosensitive resin layer is exposed to light, the light is then reflected at the surface of the substrate due to the small distance between the second negative photosensitive resin layer and the substrate, thus entering the portion of the second negative photosensitive resin layer which should not be exposed to light and is intended to be ejection openings.

SUMMARY

According to an aspect of the present disclosure, there is provided a method for manufacturing a liquid ejection head including a substrate, a flow channel member overlying the substrate and having a flow channel therein through which a liquid flows, and an ejection opening member overlying the flow channel member and having an ejection opening therein through which the liquid is ejected. The method includes forming a first negative photosensitive resin layer containing a photopolymerizable compound and a photopolymerization initiator, exposing the first negative photosensitive resin layer to light to form a latent image of the flow channel member, forming a second negative photosensitive resin layer containing a photopolymerizable compound and a photopolymerization initiator over the first negative photosensitive resin layer having the latent image, exposing the second negative photosensitive resin layer to light to form a latent image of the ejection opening member, and removing unexposed portions of the first and the second negative photosensitive resin layer to form the flow channel and the ejection opening. In this method, the first negative photosensitive resin layer has a thickness of 10 µm or less and further contain a sensitivity adjusting agent capable of reducing the sensitivity of the first negative photosensitive resin layer. The transmittance A of the first negative photosensitive resin layer is 0.70 or less for the light used to expose the second negative photosensitive resin layer.

Further features of the present disclosure will become apparent from the following description of exemplary embodiments with reference to the attached drawings.

DESCRIPTION OF THE EMBODIMENTS

Although the subject matter of the present disclosure will now be described in detail by using an ink jet recording head implementing the method of the present disclosure, it is not limited to the disclosed embodiments. For example, the liquid ejection head may be used for producing biochips or printing an electronic circuit, as well as being used as an ink jet recording head.

Alternatively, the liquid ejection head may be used for producing color filters.

Figure 1A:
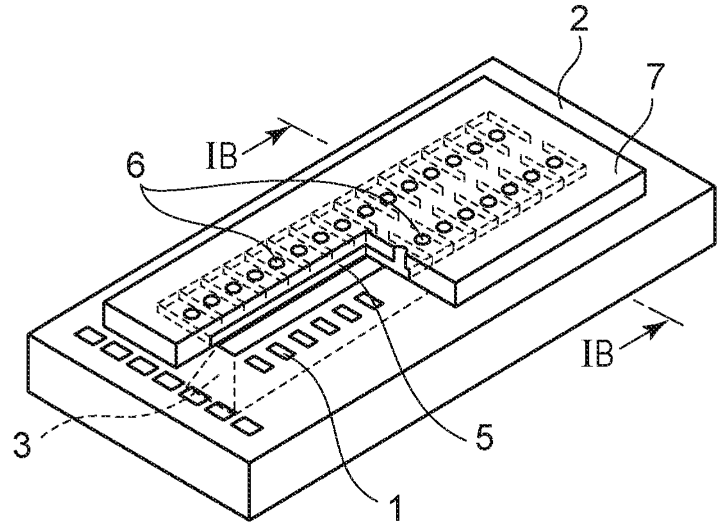
FIG. 1A is a schematic perspective view of a liquid ejection head according to an embodiment of the present disclosure.
Figure 1B:
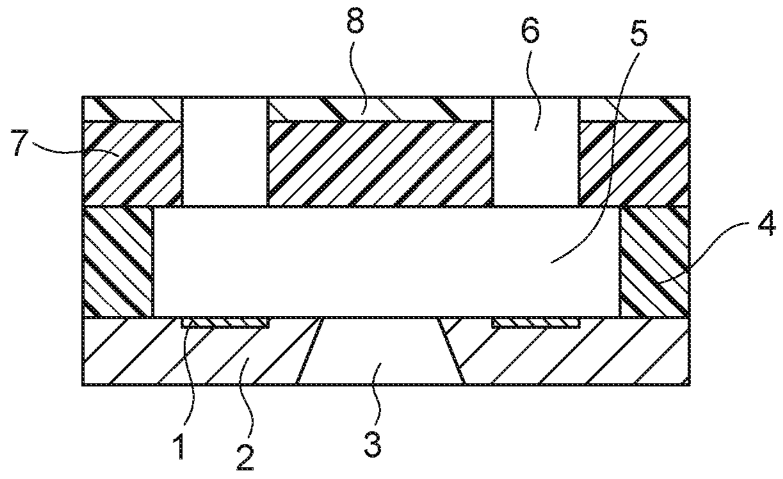
FIG. 1B is a schematic sectional view taken along line IB-IB in FIG. 1A.

FIG. 1A is a schematic perspective view of a liquid ejection head produced by a method according to an embodiment of the present disclosure, and FIG. 1B is a sectional view taken along line IB-IB in FIG. 1A, schematically illustrating a section of the head taken in the direction perpendicular to the surface of the substrate. The liquid ejection head includes a substrate 2 including a plurality of energy generating elements 1 configured to generate energy used for ejecting liquid. The energy generating elements are arranged at regular intervals. Examples of the material of the substrate 2 include silicon, silicon carbide, silicon nitride, glass (quartz glass, borosilicate glass, non-alkali glass, soda glass), alumina, gallium arsenide, gallium nitride, aluminum nitride, and aluminum alloys. The energy generating elements 1 are covered with an anti-cavitation film (not shown) made of Ta or the like to prevent the deterioration thereof by cavitation. The Ta anti-cavitation film easily reflects exposure light. In the structure formed by the method disclosed herein, however, reflection of exposure light from the substrate can be satisfactorily reduced even if the anti-cavitation film is formed. The substrate 2 has a through hole acting as a supply port 3 therein through which liquid is supplied. A flow channel member 4 defining flow channels 5 is disposed over one of the surfaces of the substrate 2. An ejection opening member 7 is disposed over the flow channel member 4 and the flow channels 5. The ejection opening member 7 has through holes therein acting as ejection openings 6. In addition, a water-repellent layer 8 may optionally be disposed over the ejection opening member 7. In this liquid ejection head, the liquid fed into the flow channels 5 through the supply port 3 is ejected as liquid droplets through the ejection openings 6 by applying a pressure generated by the energy generating elements 1 to the liquid.

A method for manufacturing the liquid ejection head shown in FIGS. 1A and 1B will now be described. FIGS. 2A to 2E are each a schematic sectional view illustrating step by step the method for manufacturing the liquid ejection head according to an embodiment of the present disclosure, and FIG. 2E shows the section of the finished liquid ejection head corresponding to FIG. 1B.

Figure 2A:
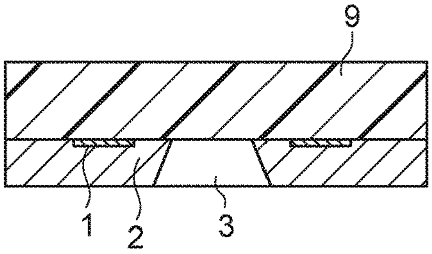
FIGS. 2A to 2E are each a schematic sectional view illustrating step by step an exemplary process for manufacturing the liquid ejection head shown in FIGS. 1A and 1B.

First, as shown in FIG. 2A, a first negative photosensitive resin layer 9 is formed of an uncured photosensitive resin composition on the substrate 2 in which energy generating elements 1 are arranged. The thickness L of the first negative photosensitive resin layer 9 is 10 μm or less from the viewpoint of reducing the height of the flow channels in the liquid ejection head to reduce the occurrence of satellites or the like. If the supply port 3 has previously been formed in the substrate 2 as shown in FIG. 2A, a composition of the first negative photosensitive resin layer may be applied onto a base film and then transferred onto the substrate 2 by lamination. The base film may be, for example, a polyethylene terephthalate (PET) film or a polyimide film. If the supply port 3 is formed after forming the first negative photosensitive resin layer 9, the first negative photosensitive resin layer 9 may be formed by spin coating or slit coating. The first negative photosensitive resin layer 9 contains a polymerizable compound and a photopolymerization initiator. The detail of the composition of the first negative photosensitive resin layer 9 will be described herein later.

The thickness L mentioned therein refers to the thickness of the portion of the first negative photosensitive resin layer 9 under the region where the ejection openings will be formed. As long as at least a part of this portion of the first negative photosensitive resin layer has a thickness of 10 μm or less, it is within the scope of the present disclosure.

Figure 2B:
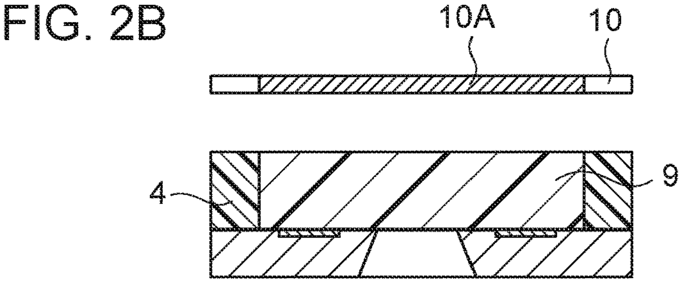

Subsequently, the first negative photosensitive resin layer 9 is exposed to light through a flow channel-forming mask 10 having a flow channel pattern to form a latent image of the flow channel member 4, as shown in FIG. 2B. At this time, the unexposed portion of the first negative photosensitive resin layer 9 remains as it is and is not cured. The exposed portion may be further cured, if necessary, by heat treatment (Post Exposure Bake). The flow channel-forming mask 10 is a photomask that is a plate made of a material capable of transmitting exposure light, such as glass or quartz, and having the flow channel pattern formed of a light-shield film 10A, such as a chrome film. Light having a wavelength of 365 nm may be used as exposure light. Such a wavelength enables high-precision patterning. For the exposure, an i-line exposure stepper may be used. Alternatively, the exposure may be performed by using a projection exposure apparatus including a mercury lamp as the light source, provided with a band pass filer capable of selectively transmitting light having a wavelength of 365 nm.

Figure 2C:
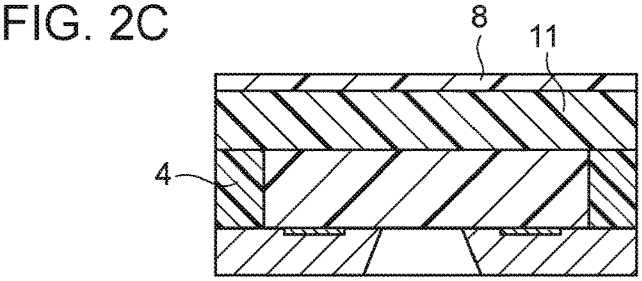

Then, as shown in FIG. 2C, a second negative photosensitive resin layer 11 is formed over the first negative photosensitive resin layer 9 having the latent image of the flow channel member 4. The second negative photosensitive resin layer 11 may be formed by lamination. More specifically, a composition of the second negative photosensitive resin layer is applied on a base film made of PET, polyimide, or the like to form a dry film.

Subsequently, the composition of the second negative photosensitive resin layer is transferred to the surface of the first negative photosensitive resin layer 9. If the second negative photosensitive resin layer 11 contains a large amount of organic solvent, the solvent causes the second negative photosensitive resin layer 11 to mix with the first negative photosensitive resin layer 9 when the second negative photosensitive resin layer 11 is formed on the first negative photosensitive resin layer 9.

Consequently, the precision of the pattern of each layer is reduced, and desired shapes may not be formed. It is therefore beneficial that the second negative photosensitive resin layer 11 in the form of a dry film is transferred to the surface of the first negative photosensitive resin layer 9. The second negative photosensitive resin layer 11 contains a polymerizable compound and a photopolymerization initiator. The detail of the composition of the second negative photosensitive resin layer 11 will be described herein later.

Next, as shown in FIG. 2C, a water-repellent layer 8 may optionally be formed over the second negative photosensitive resin layer 11. The water-repellent layer 8 is repellent to the liquid ejected from the liquid ejection head. For forming the water-repellent layer 8, a composition containing a fluorine-containing compound having a cationically polymerizable group and a perfluoroalkyl or perfluoropolyether group may be used. It is generally known that in the layer containing a compound having a perfluoroalkyl or perfluoropolyether group, the fluorine-containing groups are segregated to the interface between the layer and air by baking after the composition of the layer has been applied. The segregated fluorine-containing groups can increase the water repellency of the surface of the layer. In addition, the cationic polymerizable group of the fluorine-containing compound reacts with the resin in the second negative photosensitive resin layer 11 to tightly bind the water-repellent layer 8 to the second negative photosensitive resin layer 11.

Figure 2D:
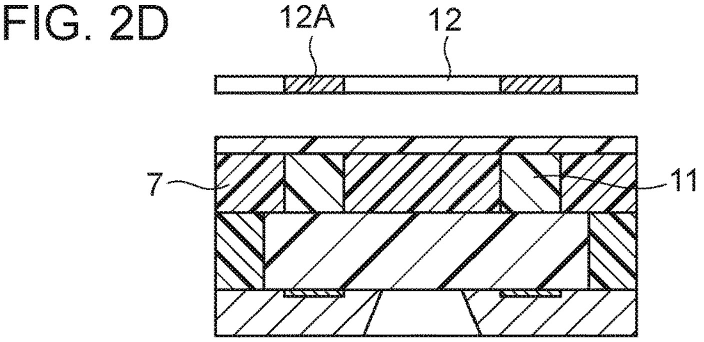
Figure 2E:
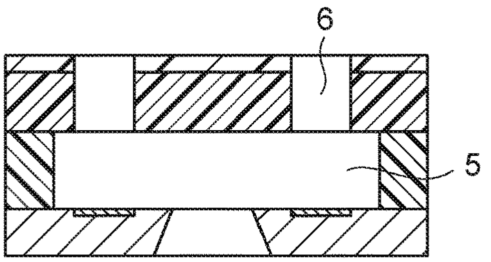

Then, the second negative photosensitive resin layer 11 and the water-repellent layer 8 are exposed to light through an ejection opening-forming mask 12 having an ejection opening pattern to form a latent image of the ejection opening member 7, as shown in FIG. 2D. The ejection opening-forming mask 12 is provided with light-shield films 12A corresponding to the ejection openings. The unexposed portion of the second negative photosensitive resin layer 11 remains as it is and is not cured. The exposed portion may be further cured, if necessary, by heat treatment (Post Exposure Bake). Light having a wavelength of 365 nm may be used as exposure light as in the exposure of the first negative photosensitive resin layer 9.

Figure 3A:
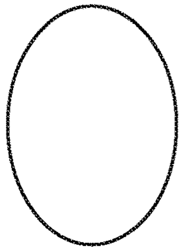
FIGS. 3A to 3C are each a plane view illustrating a shape of ejection openings, according to an embodiment of the present disclosure.
Figure 3B:
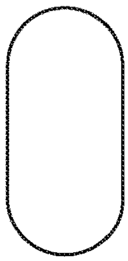
Figure 3C:
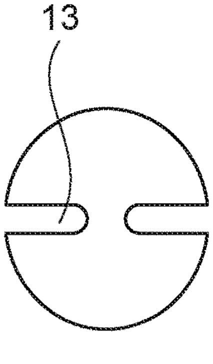

Each portion defining the ejection opening pattern, that is, the section of the ejection opening 6 taken in the direction parallel to the surface of the substrate, does not necessarily have a circular shape, and the shape thereof may be determined in view of ejection properties. For example, the shape of the ejection opening may be one of the shapes shown in FIGS. 3A to 3C. The shape of the ejection opening shown in 3A is oval, and the shape shown in FIG. 3B is rectangular with rounded ends. The shape shown in FIG. 3C is circular with a pair of opposing protrusions 13 extending toward the center of the shape. For forming the ejection openings having the shape shown in FIG. 3C, a particularly high precision is required. When an energy sufficient to eject liquid is applied to the liquid, the liquid is formed into a long columellar shape extending in the direction in which the liquid is ejected. The liquid in the columellar shape is then cut at a rearward position and ejected in a droplet form. At this time, the end of the long liquid column is in a shape of a thin tail. If the tail is long, the liquid is divided into a main droplet and satellites, which follow the main droplet and land on the printing medium, or causes mist, which does not land on the printing medium, to occur. In the case of the ejection opening shown in FIG. 3C, the protrusions 13 change the liquid column into a thin liquid film and thus enable the liquid column to be immediately cut out, thus reducing the length of the tail. Thus, by using the liquid ejection head having the ejection openings in the shape shown in FIG. 3C as an ink jet printing head, high-quality printing with reduce satellites can be achieved.

In some embodiments, the second negative photosensitive resin layer may be more sensitive than the first negative photosensitive resin layer. The term sensitivity of a negative photosensitive resin layer, mentioned herein is a measure of the exposure dose required to cure the negative photosensitive resin layer. The higher the sensitivity, the lower the exposure dose for curing the negative photosensitive resin layer. If the first negative photosensitive resin layer is more sensitive than the second negative photosensitive resin layer, the portion of the first negative photosensitive resin layer that should not be exposed to light is likely to be exposed to the light used to expose the second negative photosensitive layer. Consequently, the portion of the first negative photosensitive resin layer intended to be the flow channels is not removed in a subsequent step, and the flow channels do not become likely to be formed in a desired shape. It is therefore beneficial to control the sensitivity of the second negative photosensitive resin layer to be higher than that of the first negative photosensitive resin layer. In some embodiment, the difference in sensitivity between the first negative photosensitive resin layer and the second negative photosensitive resin layer may be large. If the sensitivity of a negative photosensitive resin layer is excessively low, it takes a long time to expose the photosensitive resin layer to light, and accordingly, the productivity is reduced. If the exposure dose for a negative photosensitive resin layer is significantly increased, the reproductivity of the patterned shape of the negative photosensitive resin layer may be reduced. Accordingly, the first negative photosensitive resin layer may be exposed to light at a dose in the range of 2,000 $J/m^2$ to 30,000 $J/m^2$, and the second negative photosensitive resin layer may be exposed to light at a dose of 500 $J/m^2$ to 5,000 $J/m^2$. In an embodiment, the first negative photosensitive resin layer may be exposed to light at a dose in the range of 10,000 $J/m^2$ to 20,000 $J/m^2$. Also, the second negative photosensitive resin layer may be exposed to light at a dose in the range of 1,000 $J/m^2$ to 3,000 $J/m^2$.

Subsequently, as shown in FIG. 2E, the unexposed portions of the first negative photosensitive resin layer 9, the second negative photosensitive resin layers 11 and the water-repellent layer 8 are removed at one time with an organic solvent, thus forming the flow channels 5 and ejection openings 6. After the removal of the unexposed portions, heat treatment may be performed, if necessary.

The negative photosensitive resin layers used in the liquid ejection head according to an embodiment of the present disclosure will now be described.

First Negative Photosensitive Resin Layer

The first negative photosensitive resin layer contains a polymerizable compound and a photopolymerization initiator. In addition, the first negative photosensitive resin layer further contains a sensitivity adjusting agent capable of reducing the sensitivity thereof. Also, the first negative photosensitive resin layer has a transmittance A of 0.70 or less for the light used to expose the second negative photosensitive resin layer.

Transmittance A

The transmittance A of the first negative photosensitive resin layer is 0.70 or less for the light used to expose the second negative photosensitive resin layer. Transmittance A is defined by the equation: $A=I/I_0=10^{-\alpha L}$, wherein $I_0$ represents the intensity of light incident on the first negative photosensitive resin layer, I represents the intensity of light that has been transmitted through the first negative photosensitive resin layer, L represents the thickness of the first negative photosensitive resin layer, and a represents the absorption coefficient of the first negative photosensitive resin layer. Transmittance A is the value determined by measuring the unexposed portion of the first negative photosensitive resin layer. The lower the transmittance A, the more the negative photosensitive resin layer attenuates light. When transmittance A is 0.70 or less, reflection of the light used to expose the second negative photosensitive resin layer from the surface of the substrate is sufficiently attenuated in the first negative photosensitive resin layer. Accordingly, the portion of the second negative photosensitive resin layer that should not be exposed to light is unlikely to be exposed to the reflected light. Consequently, even if the distance between the second negative photosensitive resin layer and the substrate is small due to the thickness L of the first negative photosensitive resin layer that is as small as 10 μm or less, the ejection openings can be precisely formed in a desired shape.

If the thickness L of the first negative photosensitive resin layer is constant, transmittance A can be controlled to a desired value by adjusting the absorption coefficient $\alpha$. The absorption coefficient $\alpha$ of the first negative photosensitive resin layer may be adjusted by the composition of the first negative photosensitive resin layer. More specifically, the absorption coefficient $\alpha$ may be increased by increasing the content of the photopolymerization initiator in the first negative photosensitive resin layer.

Unfortunately, if the content of the photopolymerization initiator in the first negative photosensitive resin layer is increased to increase the absorption coefficient $\alpha$ of the first negative photosensitive resin layer, the sensitivity of the first negative photosensitive resin layer increases. If the sensitivity of the first negative photosensitive resin layer increases, the portion of the first negative photosensitive resin layer that should not be exposed to light may be cured by the light used to expose the second negative photosensitive layer 11. If a larger amount of a photopolymerization initiator is added to control the absorption coefficient $\alpha$, therefore, a sensitivity adjusting agent (described herein later) capable of reducing the sensitivity of the first negative photosensitive resin layer is added to reduce the sensitivity of the first negative photosensitive resin layer.

In some embodiments, transmittance A may be 0.65 or less from the viewpoint of further reducing the reflection from the substrate. In an embodiment, transmittance A may be 0.20 or more, such as 0.30 or more or 0.50 or more. When transmittance A is 0.20 or more, exposure light for the first negative photosensitive resin layer enters the first negative photosensitive resin layer deep and fully cures the first negative photosensitive resin layer to bind the layer to the substrate.

Photopolymerizable Compound

The first negative photosensitive resin layer may contain a compound that can be polymerized by an acid (hereinafter referred to as acid-polymerizable compound) as the photopolymerizable compound.

The first negative photosensitive resin layer is required to have a high mechanical strength after being cured and have a high resolution sufficient as a photolithography material. It is therefore beneficial that the first negative photosensitive resin layer contains an epoxy resin as the acid-polymerizable compound. The acid-polymerizable compound may be at least one selected from the group consisting of bisphenol A or F epoxy resin, novolac epoxy resin, phenol novolac epoxy resin, cresol novolac epoxy resin, and epoxy resin having an oxycyclohexane skeleton. The epoxy resin that is the acid-polymerizable compound may have three or more functional epoxy groups. Epoxy resin having three or more functional epoxy groups is three-dimensionally crosslinked when cured, and is therefore suitable to achieve a desired mechanical strength. Commercially available epoxy resins include Celloxide (registered trademark) 2021, GT-300 series, GT-400 series, and EHPE (registered trademark) 3150 (each produced by Daicel); jER (registered trademark) 157S70 (produced by Mitsubishi Chemical); and EPICLON (registered trademark) N-695 and EPICLON (registered trademark) N-865 (each produced by DIC).

If the photopolymerizable compound content in the first negative photosensitive resin layer is reduced, the reproductivity of the pattern may decrease, or the adhesion to the substrate may decrease. Accordingly, it is beneficial that the photopolymerizable compound content in the first negative photosensitive resin layer is 90% by mass or more relative to the solids content in the first negative photosensitive resin layer.

Photopolymerization Initiator

The first negative photosensitive resin layer may contain a photo-acid generator as the photopolymerization initiator.

The photo-acid generator may be a sulfonium salt, an iodonium salt, or a bromonium salt.

If the thickness L of the first negative photosensitive resin layer is as small as, for example, 10 μm or less, it is important for the photopolymerization initiator to exhibit a high absorption of the light used to expose the second negative photosensitive resin layer. For example, the molar absorption coefficient $k_0$ of the photopolymerization initiator for the exposure light may be 1700 $L \cdot mol^{-1} \cdot cm^{-1}$ or more, such as 2500 $L \cdot mol^{-1} \cdot cm^{-1}$ or more. The reason for this is probably as below. If the thickness L is small, the absorption coefficient $\alpha$ must be increased to some extent in order to recued transmittance A to 0.70 or less. Accordingly, if a photopolymerization initiator having a low absorption is added, the amount thereof needs to be increased. However, if the proportion of the photopolymerization initiator to the photopolymerizable compound in the first negative photosensitive resin layer is excessively high, the precision of the pattern of the first negative photosensitive resin layer may decreases. This is the reason.

If the second negative photosensitive resin layer is exposed to light having a wavelength of 365 nm, an onium salt including a cationic structure having conjugated double bonds in the molecule thereof may be used as the photo-acid generator. More specifically, the onium salt may be an onium salt including a cationic structure having at least one skeleton selected from the group consisting of a 9,10-dialkoxy-anthracene skeleton, an anthraquinone skeleton, and a thioxanthone skeleton. Such an onium salt has a long series of conjugated double bonds with a low $\pi$ electron energy level in the cationic structure. Accordingly, the absorption wavelength shifts to longer wavelengths, and the salt has higher absorption of light having a wavelength of 365 nm. Examples of the photo-acid generator include onium salts having a cationic structure represented by any one of the following formulas (1-1) to (1-26):

(1-1)

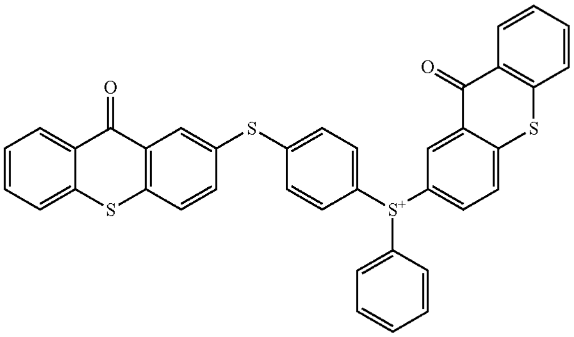

(1-2)

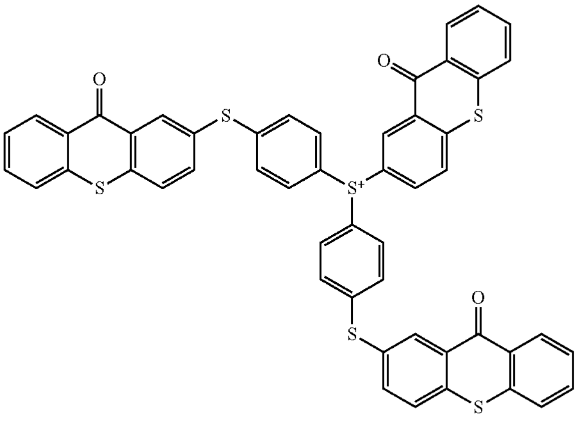

-continued
(1-3)
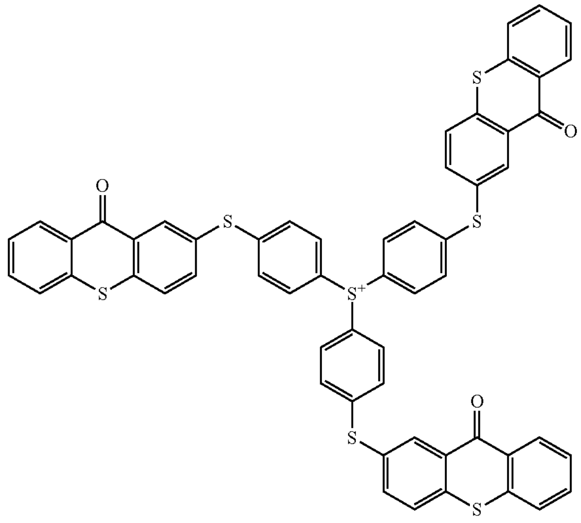
(1-4)
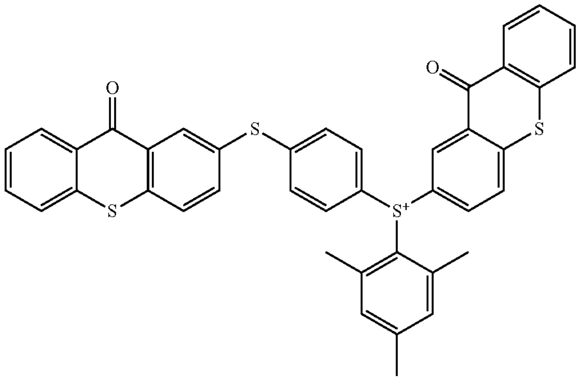
(1-5)
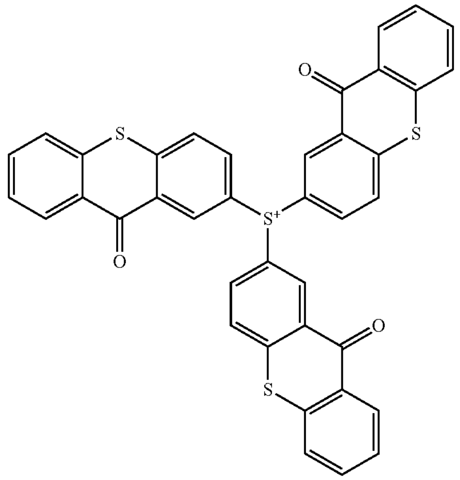
(1-6}
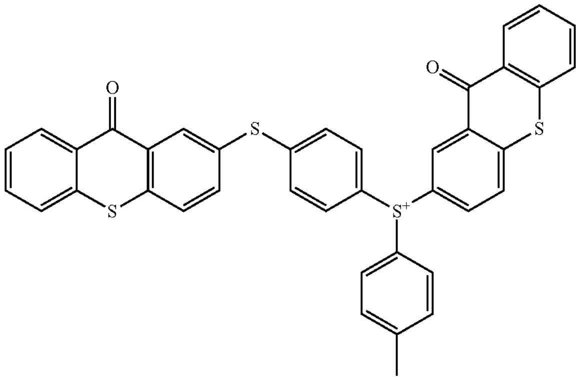
(1-7)
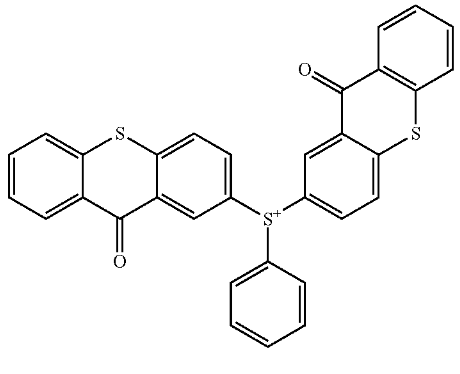
(1-8)
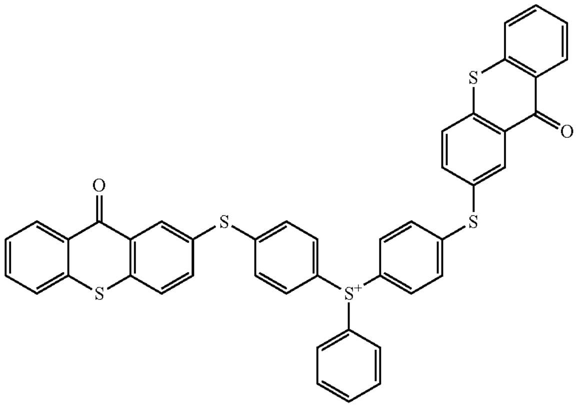

-continued
(1-9)
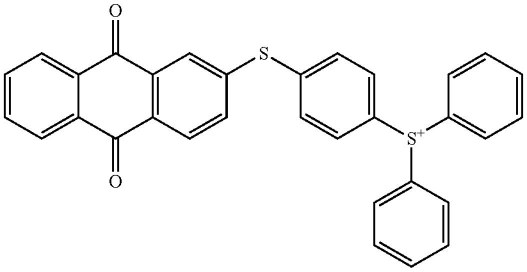
(1-10)
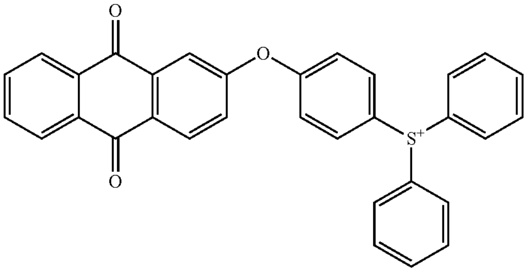
(1-11)
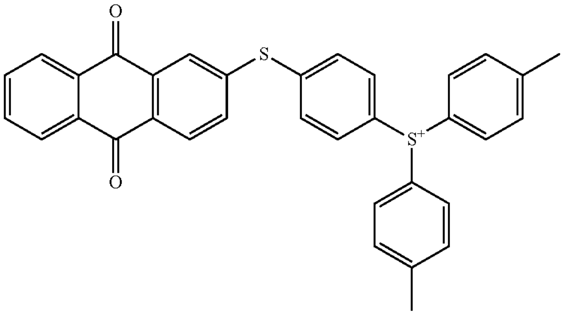
(1-12)
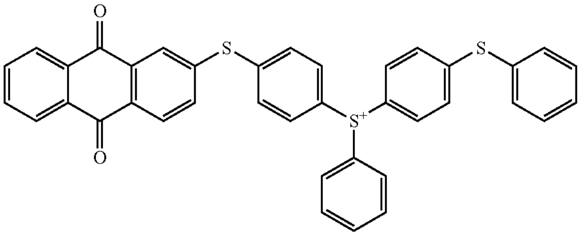
(1-13)
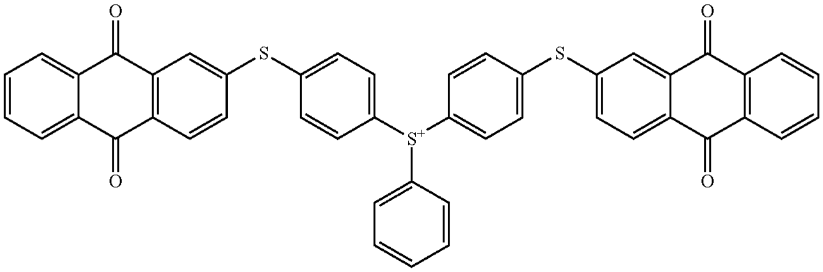
(1-14)
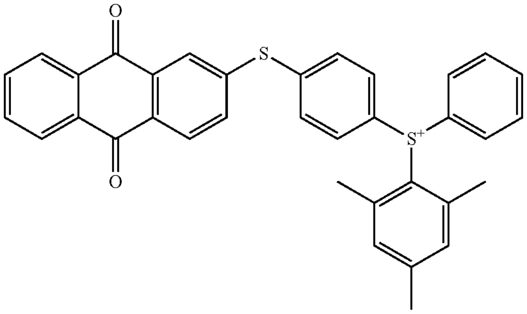
(1-15)
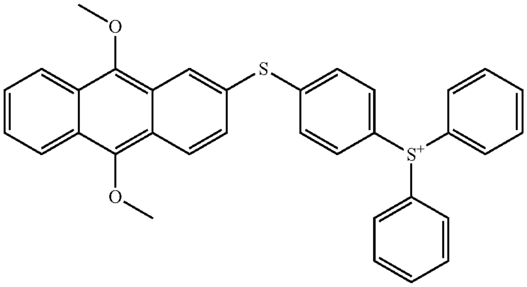
(1-16)
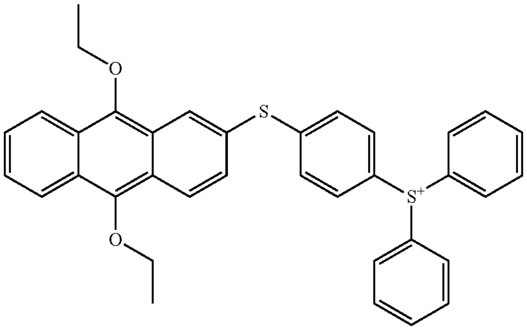
(1-17)
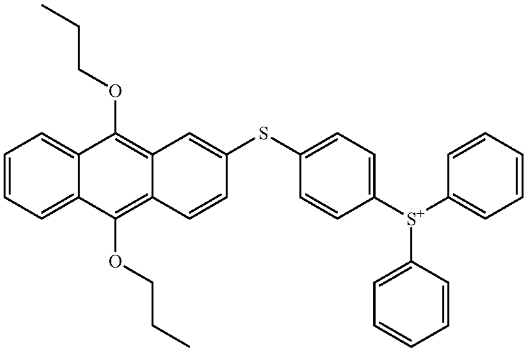

-continued
(1-18)
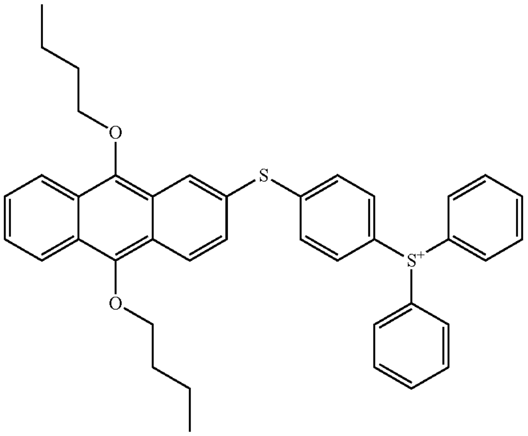
(1-19)
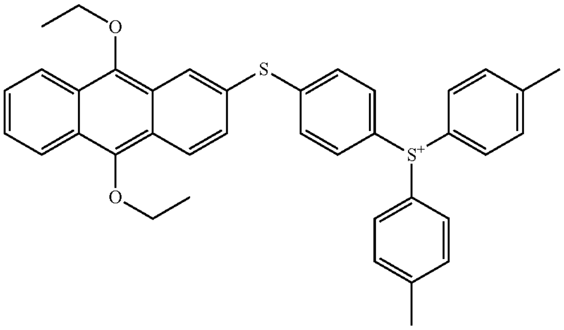
(1-20)
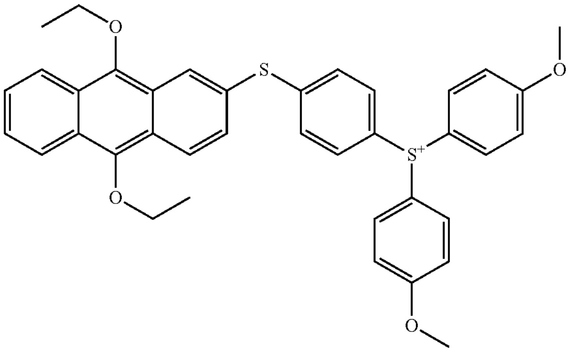
(1-21)
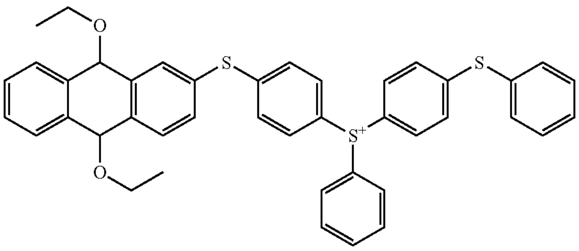
(1-22)
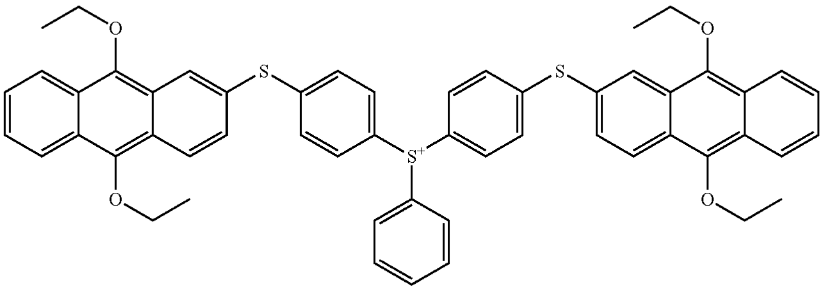
(1-23)
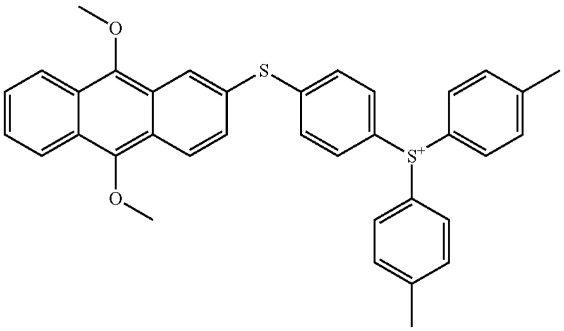
(1-24)
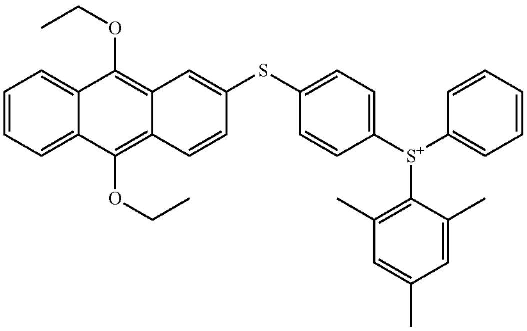

-continued
(1-25)
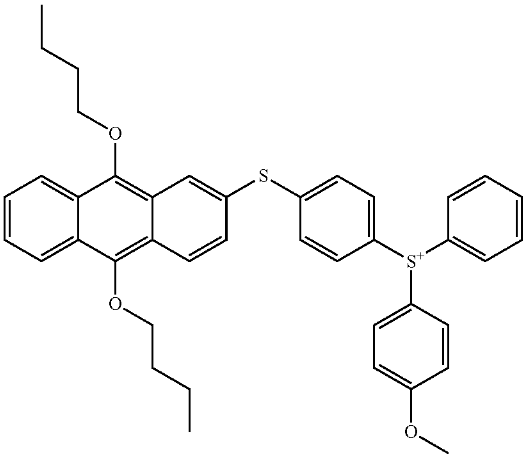
(1-26)
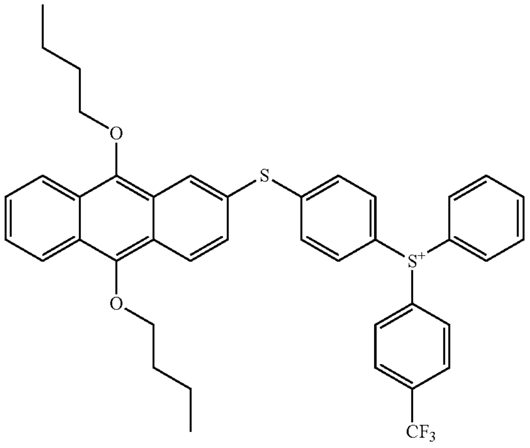
The anionic structure of the photo-acid generator may be a portion containing carbon, nitrogen, phosphorus, boron, or antimony. Examples of the photo-acid generator include onium salts including an anionic structure represented by any one of the following formulas (2-1) to (2-23):
(2-1)
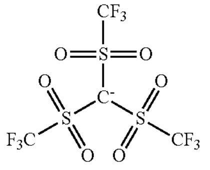
(2-2)
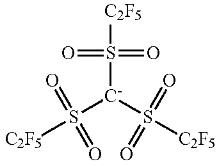
(2-3)
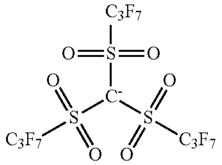
(2-4)
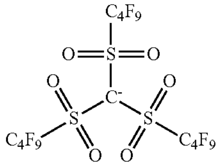
(2-5)
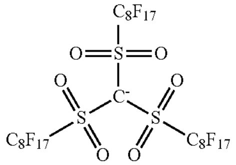
-continued
(2-6)
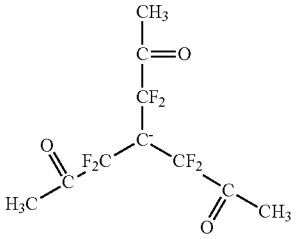
(2-7)
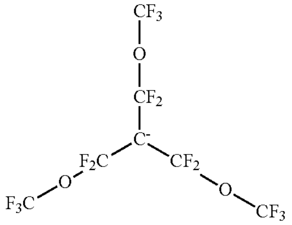
(2-8)
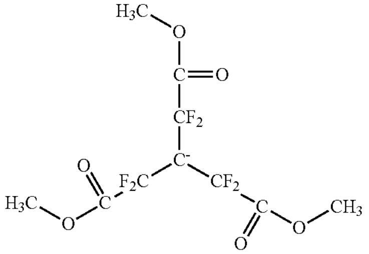
(2-9)
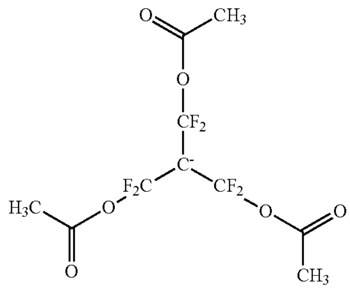

-continued (2-10)

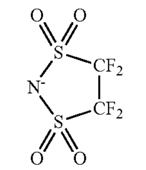

(2-11)

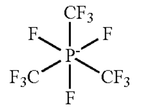

(2-12)

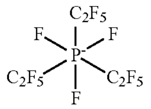

(2-13)

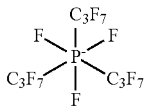

(2-14)

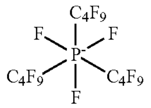

(2-15)

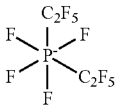

(2-16)

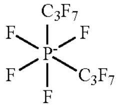

(2-17)

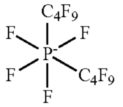

(2-18)

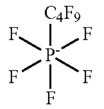

(2-19)

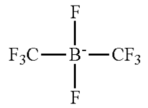

(I 2-20)

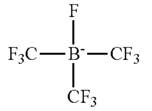

(2-21)

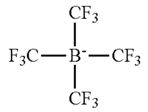

-continued (2-22)

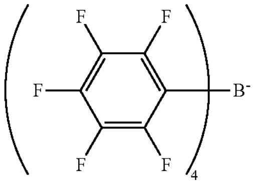

(2-23)

$SbF_6^-$

The photo-acid generator is commercially available, and examples thereof include ADEKA Optomer SP-172 (produced by ADEKA) and CPI-210 and CPI-410 (each produced by San-Apro).

The photopolymerization initiator content in the first negative photosensitive resin layer is controlled so that the transmittance A of the first negative photosensitive resin layer can come to a desired value. More specifically, the photopolymerization initiator content in the first negative photosensitive resin layer may be 0.1% by mass or more, such as 1.0% by mass or more, relative to the solids content in the first negative photosensitive resin layer. However, an excessive amount of photopolymerization initiator relatively reduces the proportion of the photopolymerizable compound in the first negative photosensitive resin layer. This may reduce the precision of the pattern. Accordingly, it is beneficial that the photopolymerization initiator content in the first negative photosensitive resin layer is 10.0% or less, such as 7.0% by mass or less. If a photo-acid generator that is an onium salt including a cationic structure having conjugated double bonds in the molecule thereof is used as the photopolymerization initiator, the photo-acid generator content may be in the range of 1.0% by mass to 10.0% by mass and beneficially 7.0% by mass or less.

Sensitivity Adjusting Agent

As described above, a sensitivity adjusting agent is added to the first negative photosensitive resin layer to reduce the sensitivity of the first negative photosensitive resin layer.

The molar absorption coefficient k of the sensitivity adjusting agent for the light used to expose the second negative photosensitive resin layer may be 1/10 or less of the molar absorption coefficient $k_0$ of the photopolymerization initiator for the same light. If the sensitivity adjusting agent has a high absorption for exposure light as with the photopolymerization initiator, the sensitivity is reduced, and, in addition, the absorption coefficient $\alpha$ is varied. This makes it difficult to control the sensitivity and the transmittance A as desired. Molar absorption coefficient k is defined by k=Abs/cl. Absorbance Abs can be measured with a spectrophotometer equipped with a cell of 1 (cm) in length containing a solution of a target compound with a concentration c (molar concentration). In an embodiment, molar absorption coefficient k may be 1/100 or less of molar absorption coefficient $k_0$. More specifically, molar absorption coefficient k may be 200 $L \cdot mol^{-1} \cdot cm^{-1}$ or less, such as 150 $L \cdot mol^{-1} \cdot cm^{-1}$ or less.

If the photopolymerization initiator in the first negative photosensitive resin layer is a photo-acid generator, the sensitivity adjusting agent may contain a basic substance or an acid generator capable of generating a weak acid. The basic substance can deactivate the acid generated from the photo-acid generator and is effective in reducing the sensitivity of the first negative photosensitive resin layer. An acid generator capable of generating a weak acid generates an acid having a pKa in the range of −1.5 to 3.0, and salt exchange occurs between the weak acid and the acid generated from the photo-acid generator. The weak acid after the salt exchange cannot polymerize or does not easily polymerize the polymerizable compound. Consequently, the sensitivity of the first negative photosensitive resin layer is reduced.

The basic substance may be a compound having an unshared electron pair. The compound having an unshared electron pair may be a compound containing nitrogen, sulfur, phosphorus, or the like. In some embodiments, it may be an amine compound. Examples of the amine compound include amines substituted by one or more hydroxyalkyl groups having a carbon number of 1 to 4, such as diethanolamine, triethanolamine, and triisopropanolamine; pyrimidine compounds, such as pyrimidine, 2-aminopyrimidine, and 4-aminopyrimidine; pyridine compounds, such as pyridine and methylpyridine; and aminophenols, such as 2-aminophenol and 3-aminophenol.

The acid generator capable of generating an acid having a pKa in the range of −1.5 to 3.0 may be an onium salt capable of generating toluenesulfonic acid. Such an onium salt may be a sulfonium salt, an iodonium salt, or a bromonium salt. Commercially available onium salts capable of generating toluenesulfonic acid include TPS-1000 produced by Midori Kagaku and WPAG-367 produced by Wako Pure Chemical Industries.

Other Ingredients

The first negative photosensitive resin layer may further contain a silane coupling agent from the viewpoint of enhancing the adhesion to the substrate. The silane coupling agent is commercially available, and, for example, A-187 produced by Momentive Performance Materials may be used.

Beneficially, the first negative photosensitive resin layer does not contain a light absorbent capable of absorbing the light used to expose the second negative photosensitive resin layer. The present disclosure is based on the idea that absorption of reflected light is controlled by the photopolymerization initiator content while the sensitivity of the resin layer is controlled by the further added sensitivity adjusting agent, as described above. If additives other than the photopolymerization initiator and the sensitivity adjusting agent vary the sensitivity or the absorption of the resin layer, the system is undesirably complexed. It is therefore beneficial to minimize the addition of a light absorbent generally used for merely absorbing light. More specifically, the light absorbent content in the first negative photosensitive resin layer may be 0.01% by mass or less, such as 0.001% by mass or less, relative to the solids content.

Second Negative Photosensitive Resin Layer

The second negative photosensitive resin layer contains a polymerizable compound and a photopolymerization initiator.

The photopolymerizable compound contained in the second negative photosensitive resin layer may be the same epoxy resin as in the first negative photosensitive resin layer. If each of the first and the second negative photosensitive resin layer contains an epoxy resin, the epoxy resins react with and cure each other, thus enhancing the adhesion between the flow channel member 4 and the ejection opening member 7.

The photopolymerization initiator may be selected from among sulfonic acid compounds, diazomethane compounds, sulfonium salts, iodonium salts, and disulfone-based compounds. The photopolymerization initiator is commercially available, and examples thereof include ADEKA Optomer SP-172 and ADEKA Optomer SP-150 (each produced by ADEKA); CPI-210, CPI-300, and CPI-410 (each produced by San-Apro); and Irgacure (registered trademark) 290 (produced by BASF). In some embodiments, the same photo-acid generator as in the first negative photosensitive resin layer, which is sensitive to light having a wavelength of 365 nm, may be used.

The transmittance B of the second negative photosensitive resin layer may be 0.30 or more, beneficially 0.80 or more, for the light used to expose the second negative photosensitive resin layer. When transmittance B is 0.30 or more, the light used to exposure the second negative photosensitive resin layer enters the second negative photosensitive resin layer deep and fully cures the second negative photosensitive resin layer to bind this layer to the first negative photosensitive resin layer. When transmittance B is 0.80 or more, the reproductivity of the mask pattern is increased.

The product A×B of transmittances A and B may be 0.70 or less, such as 0.60 or less. When the product A×B of the transmittances A and B is 0.70 or less, the intensity of light reaching the substrate is reduced, and accordingly, the intensity of reflected light is reduced.

EXAMPLES

The subject matter of the present disclosure will be further described in detail with reference to the following Examples, which are not intended to limit the disclosure.

Examples 1 to 9, Comparative Examples 1 to 3

Compositions of the first negative photosensitive resin layer shown in Table 1 and the composition of the second negative photosensitive resin layer shown in Table 2 were prepared. The epoxy resins used were jER (registered trademark) 157S70, jER (registered trademark) 1007, and jER (registered trademark) 1009 (each produced by Mitsubishi Chemical) and EPICLON (registered trademark) N-695 (produced by DIC). The photo-acid generators used were ADEKA Optomer SP-172 (produced by ADEKA and CPI-410 (produced by San-Apro). jER 157S70 and EPICLON N-695 are trifunctional or higher functional epoxy resins, and jER 1007 and jER 1009 are bifunctional epoxy resins. The sensitivity adjusting agent was TPS-1000 (produced by Midori Kagaku.

Each ingredient is represented by parts by mass except that ADEKA Optomer SP-172, which is in the form of a propylene carbonate solution with a solids content of 50% by mass, is represented as a parts-by-mass value of the solution.

The absorption coefficient α of each composition was determined by measuring the transmittance of the coating film of the composition for light having a wavelength of 365 nm with a spectrophotometer U-3300 (manufactured by Hitachi), and converting the transmittance to a value per micrometer as the absorption coefficient α. The coating film was formed by applying the composition onto a quartz plate by spine coating and baking the applied composition.

TABLE 1

| | Product name | Composition 1 | Composition 2 | Composition 3 | Composition 4 | Composition 5 | Composition 6 | Composition 7 |
|---|---|---|---|---|---|---|---|---|
| Epoxy resin | 157S70 | — | 100 | 100 | 100 | 100 | 100 | 100 |
| | EPICLON N695 | 100 | — | — | — | — | — | — |
| | jER1007 | — | 20 | 20 | — | 20 | 20 | 20 |
| | jER1009 | 20 | — | — | 20 | — | — | — |
| Photo-acid generator | CPI-410 | 1.2 | 1.4 | 2.1 | 3.5 | 6.0 | 8.0 | 12.0 |
| | SP-172 | 5.8 | — | — | — | — | — | — |
| Sensitivity adjusting agent | TPS-1000 | 0.38 | 0.23 | 0.38 | 0.68 | 1.23 | 1.66 | 2.53 |
| Silane coupling agent | A-187 | 4.3 | 4.3 | 4.3 | 4.3 | 4.3 | 4.3 | 4.3 |
| Solvent | PGMEA | | | | 200-600 | | | |
| Absorption coefficient α/μm | | 0.013 | 0.012 | 0.019 | 0.031 | 0.053 | 0.071 | 0.107 |
| Percentage of epoxy resin | | 91% | 95% | 95% | 93% | 91% | 90% | 86% |

TABLE 2

| | Product name | Composition |
|---|---|---|
| Epoxy resin | EHPE-3150 | 100 |
| Photo-acid generator | CPI-410 | 0.5 |
| Silane coupling agent | A-187 | 5 |
| Solvent | PGMEA | 80-200 |
| Absorption coefficient α/μm | | 0.005 |

Liquid ejection heads of Examples and Comparative Examples were produced in the process illustrated in FIGS. 4A to 4E, using one of the compositions shown in Table 1 and the composition shown in Table 2. The process illustrated in FIGS. 4A to 4E is similar to the process illustrated in FIGS. 2A to 2E but is different in that the water-repellent layer is not formed.

In the process for producing the liquid ejection head of each of the Examples and Comparative Examples, the first negative photosensitive resin layer and the second negative photosensitive resin layer were formed so as to have the properties shown in Tables 3 and 4.

Figure 4A:
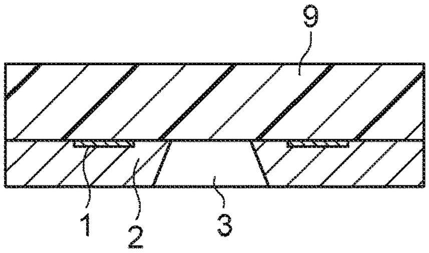
FIGS. 4A to 4E are each a schematic sectional view illustrating step by step the process for manufacturing liquid ejection heads, according to an embodiment of the present disclosure.

First, as shown in FIG. 4A, the first negative photosensitive resin layer 9 was formed. In this step, the composition of the first negative photosensitive resin layer was applied onto a 100 μm-thick PET film and was then baked at 80° C. for 5 minutes to yield a film of the composition. Then, a substrate 2 including energy generating elements 1 and having a supply port 3 was prepared. The energy generating elements 1 are covered with a 200 nm-thick Ta anti-cavitation film. The composition of the first negative photosensitive resin layer in the form of a dry film was transferred to the surface of the substrate 2 by lamination with applying heat of 80° C.

Figure 4B:
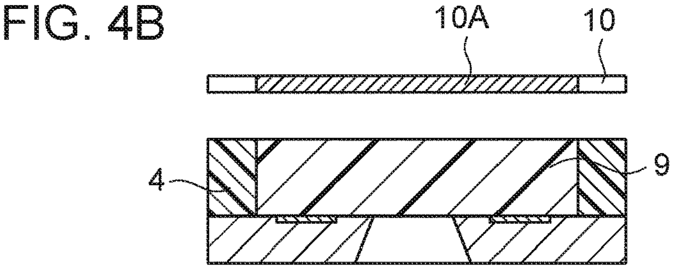

Subsequently, as shown in FIG. 4B, the first negative photosensitive resin layer 9 was exposed to light through a flow channel-forming mask 10 having a flow channel pattern. The first negative photosensitive layer 9 was further heat-treated at 50° C. for 5 minutes for curing to yield the flow channel member 4.

Figure 4C:
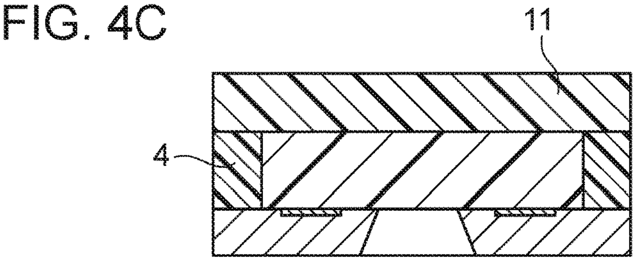

Then, as shown in FIG. 4C, the second negative photosensitive resin layer 11 was formed on the first negative photosensitive resin layer 9. In this step, first, the composition of the second negative photosensitive resin layer was applied onto a 100 μm-thick PET film and was then baked at 90° C. for 5 minutes to yield a film of the composition. Subsequently, the film of the composition of the second negative photosensitive resin layer was transferred to the surface of the first negative photosensitive resin layer 9 by lamination with applying heat of 50° C.

Figure 4D:
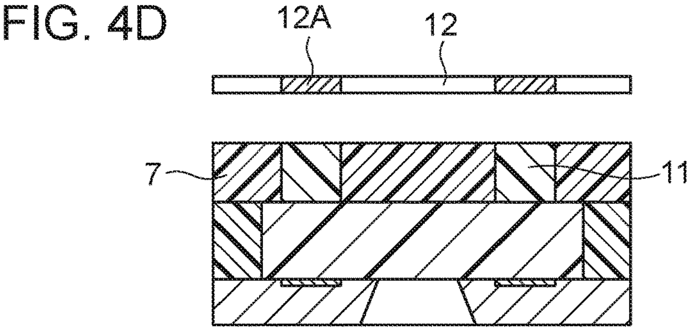

The second photosensitive resin layer 11 was then exposed to light at an exposure dose of 1,800 J/$m^2$ with an i-line exposure stepper through an ejection opening-forming mask 12 having an ejection opening pattern, as shown in FIG. 4D. The ejection opening pattern had the shape shown in FIG. 3C. The exposed portion was further heated at 90° C. for 5 minutes for curing to yield the ejection opening member 7.

Figure 4E:
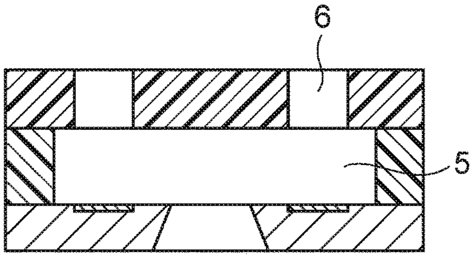

Subsequently, as shown in FIG. 4E, the unexposed portions of the first negative photosensitive resin layer 9 and the second negative photosensitive resin layers 11 were removed at one time with propylene glycol monomethyl ether acetate (PGMEA) that is a solvent, thus forming the flow channels 5 and ejection openings 6. The structure was further cured by heating at 200° C. to yield a liquid ejection head.

TABLE 3

| | Example 1 | Example 2 | Example 3 | Example 4 | Example 5 | Example 6 | Example 7 | Example 8 | Example 9 |
|---|---|---|---|---|---|---|---|---|---|
| First negative photosensitive resin layer composition | Composition 3 | Composition 3 | Composition 4 | Composition 4 | Composition 5 | Composition 5 | Composition 6 | Composition 6 | Composition 7 |
| First negative photosensitive resin layer thickness | 10 μm | 10 μm | 5 μm | 10 μm | 5 μm | 10 μm | 5 μm | 3 μm | 3 μm |
| Second negative photosensitive resin layer thickness | 10 μm | 2 μm | 10 μm | 10 μm | 10 μm | 10 μm | 10 μm | 5 μm | 5 μm |

TABLE 3-continued

| | Example 1 | Example 2 | Example 3 | Example 4 | Example 5 | Example 6 | Example 7 | Example 8 | Example 9 |
|---|---|---|---|---|---|---|---|---|---|
| Transmittance A | 0.65 | 0.65 | 0.70 | 0.49 | 0.54 | 0.29 | 0.44 | 0.61 | 0.48 |
| Transmittance B | 0.89 | 0.98 | 0.89 | 0.89 | 0.89 | 0.89 | 0.89 | 0.94 | 0.94 |
| Transmittance A × Transmittance B | 0.58 | 0.64 | 0.62 | 0.44 | 0.48 | 0.26 | 0.39 | 0.58 | 0.45 |
| First negative photosensitive layer exposure dose [J/m$^2$] | 14000 | 14000 | 12000 | 15000 | 15000 | 25000 | 19000 | 15000 | 25000 |
| Shape of ejection openings at head surface | A | B | A | A | A | A | A | A | A |
| Shape of section of ejection openings | A | B | B | A | A | A | A | A | A |
| Separation | A | A | A | A | A | A | A | A | A |

TABLE 4

| | Comparative Example 1 | Comparative Example 2 | Comparative Example 3 |
|---|---|---|---|
| First negative photosensitive resin layer composition | Material 1 | Material 2 | Material 3 |
| First negative photosensitive resin layer thickness | 10 μm | 10 μm | 5 μm |
| Second negative photosensitive resin layer thickness | 10 μm | 10 μm | 10 μm |
| Transmittance A | 0.74 | 0.75 | 0.81 |
| Transmittance B | 0.89 | 0.89 | 0.89 |
| Transmittance A × Transmittance B | 0.66 | 0.67 | 0.72 |
| First negative photosensitive layer exposure dose [J/m$^2$] | 7000 | 10000 | 10000 |
| Shape of ejection openings at head surface | B | C | C |
| Shape of section of ejection openings | C | C | C |
| Separation | A | A | A |

Evaluation

The thus prepared liquid ejection heads were subjected to the following examinations, and the results are shown in Tables 3 and 4.

The ends of the ejection openings of each liquid ejection head were observed under a scanning electron microscope (SEM) manufactured by Hitachi at a magnification of 5,000 times and evaluated according to the following criteria shown in Table 5 by comparison with the shape of the mask pattern.

TABLE 5

| Shape of ejection openings at head surface | Shape comparison between mask and ejection openings |
|---|---|
| A | Similar |
| B | Approximately similar |
| C | Different |

Furthermore, the liquid ejection head was cut with a dicing machine, and a section of the ejection openings was observed under an SEM manufactured by Hitachi at a magnification of 5,000 times for checking the projections of the section. The shape of the protrusions was evaluated according to the criteria shown in the following Table 6.

TABLE 6

| Shape of section of ejection openings | Shape comparison between mask and ejection openings |
|---|---|
| A | Similar |
| B | Approximately similar |
| C | Different |

Also, the liquid ejection head was charged with 30 wt % 2-pyrrolidone aqueous solution and stored in an environment of 70° C. for 3 months. After the storage test, the liquid ejection head was checked for separation of the first negative photosensitive resin layer from the substrate by observation under an optical microscope manufactured by NIKON at a magnification of 20 times. The liquid ejection head was evaluated as shown in Table 7 depending on whether or not the separation occurred.

TABLE 7

| Separation | Did separation occur? |
|---|---|
| A | No |
| B | Yes |

Each of the liquid ejection heads of Examples 1 to 9 had ejection openings that had been precisely formed. Also, the first negative photosensitive resin layer was not separate from the substrate. In particular, the liquid ejection heads of Examples 1, 2, 3, 5, and 8 did not have separate in spite of low exposure doses, suggesting high productivity.

On the other hand, the liquid ejection heads of Comparative Examples 1 to 3 did not have ejection openings in a desired shape. This is probably because the portion of the first negative photosensitive resin layer that should not be exposed to light was exposed to light reflected from the surface of the substrate due to the transmittance A that was as high as more than 0.70.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-086450 filed Apr. 25, 2017, which is hereby incorporated by reference herein in its entirety.

What is claimed is:

1. A method for manufacturing a liquid ejection head including a substrate, a flow channel member overlying the substrate and having a flow channel therein through which a liquid flows, and an ejection opening member overlying the flow channel member and having an ejection opening therein through which the liquid is ejected, the method comprising:

forming a first negative photosensitive resin layer over the substrate, the first negative photosensitive resin layer containing a photopolymerization initiator, a photopolymerizable compound, and a sensitivity adjusting agent capable of reducing the sensitivity of the first negative photosensitive resin layer, the first negative photosensitive resin layer having a thickness of 10 μm or less;

exposing the first negative photosensitive resin layer to light to form a latent image of the flow channel member;

forming a second negative photosensitive resin layer containing a photopolymerization initiator and a photopolymerizable compound over the first negative photosensitive resin layer having the latent image;

exposing the second negative photosensitive resin layer to light to form a latent image of the ejection opening member; and removing unexposed portions of the first and the second negative photosensitive resin layer to form the flow channel and the ejection opening, wherein the first negative photosensitive resin layer has a transmittance A of 0.70 or less for the light used to expose the second negative photosensitive resin layer.

2. The method according to claim 1, wherein the second negative photosensitive resin layer is exposed to light having a wavelength of 365 nm.

3. The method according to claim 1, wherein the first and the second negative photosensitive resin layer are exposed to light having the same wavelength.

4. The method according to claim 1, wherein the first negative photosensitive resin layer contains a photo-acid generator as the photopolymerization initiator.

5. The method according to claim 4, wherein the photo-acid generator is an onium salt including a cationic structure having at least one skeleton selected from the group consisting of a 9,10-dialkoxyanthracene skeleton, an anthraquinone skeleton, and a thioxanthone skeleton.

6. The method according to claim 1, wherein the first negative photosensitive resin layer contains an epoxy resin as the photopolymerizable compound.

7. The method according to claim 1, wherein the sensitivity adjusting agent contains one of a basic substance and an acid generator capable of generating an acid having a pKa in the range of −1.5 to 3.0.

8. The method according to claim 1, wherein the sensitivity adjusting agent contains an acid generator capable of generating toluenesulfonic acid.

9. The method according to claim 1, wherein the molar absorption coefficient k of the sensitivity adjusting agent for the light used to expose the second negative photosensitive resin layer is 1/10 or less of the molar absorption coefficient $k_0$ of the photopolymerization initiator in the first negative photosensitive resin layer for the light used to expose the second negative photosensitive resin layer.

10. The method according to claim 1, wherein the molar absorption coefficient $k_0$ of the photopolymerization initiator in the first negative photosensitive resin layer is 1,700 $L \cdot mol^{-1} \cdot cm^{-1}$ or more for the light used to expose the second negative photosensitive resin layer.

11. The method according to claim 1, wherein the transmittance A is 0.30 or more for the light used to expose the second negative photosensitive resin layer.

12. The method according to claim 1, wherein the second negative photosensitive resin layer has a transmittance B of 0.30 or more for the light used to expose the second negative photosensitive resin layer.

13. The method according to claim 1, wherein product A×B of the transmittances A and the transmittance B of the second negative photosensitive resin layer for the light used to expose the second negative photosensitive resin layer is 0.70 or less.

14. The method according to claim 1, wherein the second negative photosensitive resin layer is exposed to light at a dose in the range of 500 $J/m^2$ to 5,000 $J/m^2$.

15. The method according to claim 1, wherein the content of the photopolymerizable compound in the first negative photosensitive resin layer is 90% by mass or more relative to the solids content in the first negative photosensitive resin layer.

* * * * *